United States Patent
Lee

(10) Patent No.: US 10,079,221 B2
(45) Date of Patent: Sep. 18, 2018

(54) SEMICONDUCTOR APPARATUS INCLUDING A PLURALITY OF CHANNELS AND THROUGH-VIAS

(71) Applicant: SK hynix Inc., Icheon-si, Gyeonggi-do (KR)

(72) Inventor: Dong Uk Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 904 days.

(21) Appl. No.: 14/543,278

(22) Filed: Nov. 17, 2014

(65) Prior Publication Data

US 2016/0013157 A1  Jan. 14, 2016

(30) Foreign Application Priority Data

Jul. 10, 2014 (KR) .................. 10-2014-0086803

(51) Int. Cl.
| | | |
|---|---|---|
| *H01L 25/065* | (2006.01) | |
| *H01L 25/18* | (2006.01) | |
| *G11C 5/06* | (2006.01) | |
| *G11C 29/02* | (2006.01) | |
| *G11C 29/00* | (2006.01) | |
| *H01L 23/00* | (2006.01) | |
| *G11C 29/44* | (2006.01) | |

(52) U.S. Cl.
CPC .......... *H01L 25/0657* (2013.01); *G11C 5/063* (2013.01); *G11C 29/025* (2013.01); *G11C 29/702* (2013.01); *H01L 25/18* (2013.01); *G11C 29/44* (2013.01); *G11C 2029/4402* (2013.01); *H01L 24/16* (2013.01); *H01L 2224/16145* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2225/06565* (2013.01); *H01L 2924/15311* (2013.01)

(58) Field of Classification Search
CPC .................. H01L 25/0657; H01L 2225/06541
See application file for complete search history.

(56) References Cited

U.S. PATENT DOCUMENTS

| | | | |
|---|---|---|---|
| 7,969,193 B1 * | 6/2011 | Wu ...................... | H01L 25/0657 257/758 |
| 8,339,879 B2 | 12/2012 | Choi et al. | |
| 9,432,298 B1 * | 8/2016 | Smith ................. | H04L 49/9057 |
| 9,646,720 B2 * | 5/2017 | Yang ................... | H01L 25/0657 |
| 2012/0104388 A1 * | 5/2012 | Choi .................... | G11C 29/806 257/48 |
| 2013/0093099 A1 | 4/2013 | Shin et al. | |
| 2013/0214389 A1 * | 8/2013 | Lee ..................... | G11C 29/702 257/621 |

(Continued)

*Primary Examiner* — Jaehwan Oh
(74) *Attorney, Agent, or Firm* — William Park & Associates Ltd.

(57) ABSTRACT

A semiconductor apparatus includes a plurality of stacked chips. Each of the plurality of stacked chips may include a plurality of through-vias, each formed at a corresponding location in the plurality of through-vias, and each of the plurality of through-vias is electrically coupled with a through-via in a neighboring stacked chip in a diagonal direction. The semiconductor apparatus includes a plurality of through-via arrays, and performs repair operation with a unit of the through-via array.

17 Claims, 9 Drawing Sheets

(56) References Cited

U.S. PATENT DOCUMENTS

| | | | |
|---|---|---|---|
| 2013/0294184 A1* | 11/2013 | Yang | H01L 25/0657 365/200 |
| 2014/0110710 A1* | 4/2014 | Gorman | G11C 29/006 257/48 |
| 2014/0145753 A1* | 5/2014 | Tseng | H03K 19/003 326/9 |
| 2014/0184322 A1* | 7/2014 | Tseng | H01L 25/0657 327/566 |
| 2014/0185174 A1* | 7/2014 | Tseng | H02H 3/20 361/91.1 |
| 2014/0340113 A1* | 11/2014 | Tseng | H03K 19/003 326/9 |

\* cited by examiner

SEMICONDUCTOR APPARATUS INCLUDING A PLURALITY OF CHANNELS AND THROUGH-VIAS

CROSS-REFERENCES TO RELATED APPLICATION

The present application claims priority under 35 U.S.C. § 119(a) to Korean application number 10-2014-0086803, filed on Jul. 10, 2014, in the Korean Intellectual Property Office, which is incorporated herein by reference in its entirety.

BACKGROUND

1. Technical Field

Various embodiments relate to a semiconductor apparatus, and more particularly, to a semiconductor apparatus having a plurality of channels and through-vias.

2. Related Art

In order to increase integrity of a semiconductor apparatus, a 3 dimensional (3D) semiconductor apparatus, in which a plurality of chips are stacked and packaged in single package, has been proposed. The 3D semiconductor apparatus achieves the maximum integrity in given space by vertically stacking two or more chips.

According to one of existing various embodiments for the 3D semiconductor apparatus, a plurality of same chips are stacked and the plurality of same chips are coupled to each other through wires like metal lines. The plurality of same chips operates as single semiconductor apparatus.

On the other hand, there is provided "Through Silicon Via" (TSV) electrically coupling all of a plurality of stacked chips by penetrating the plurality of stacked chips with "Via". A semiconductor apparatus of the TSV structure vertically penetrating and coupling each of the plurality of chips effectively achieves smaller size of a package than a semiconductor apparatus of the wire structure coupling each of the plurality of chips through edge-wiring.

The plurality of chips included in the semiconductor apparatus form channels, respectively. The channels may transfer different control signals or data from one another. Each of the plurality of chips independently operates.

SUMMARY

In an embodiment of the invention, a semiconductor apparatus may include a plurality of stacked chips. Each of the plurality of stacked chips may include first to Mth through-vias, each formed by penetrating each of the plurality of stacked chips at a corresponding location, wherein M is a number greater than or equal to 3. Each of the plurality of stacked chips may also include a plurality of input/output circuits, each electrically coupled to a $\{1+(L*K)\}$th through-via of the plurality of stacked chips, wherein L is one of 0 and a number greater than or equal to 1. Each of the plurality of stacked chips may also include a data transmission section configured to transmit data to one of $\{1+(J*K)\}$th through-via, $\{1+((J-1)*K)\}$th through-via, and $\{1+((J+1)*K)\}$th through-via based on repair information, wherein J is a natural number, and wherein K represent a number of channels of the semiconductor apparatus.

In an embodiment of the invention, a semiconductor apparatus may include first to Nth stacked chips. Each of the first to Nth stacked chips may include first to Mth through-vias, each of which is disposed at corresponding locations and is electrically coupled with a through-via of a adjacently stacked chips in a diagonal direction, wherein N is a natural number equal to or greater than 2, and M is a natural number equal to or greater than 3, wherein each of the first to Nth stacked chips comprises a data transmission section configured to transmit data to $\{1+(L*K)\}$th through-via based on repair information, wherein L is one of 0 and a natural number, and J is a natural number, and wherein K represent a number of channels of the semiconductor apparatus.

In an embodiment of the invention, a semiconductor apparatus comprising a plurality of stacked chips, wherein the plurality of stacked chips each comprise a plurality of vias disposed at corresponding locations and electrically with a through-via of one of the plurality of stacked chips. The plurality of stacked chips each also comprise a data transmission section configured to select the plurality of through-vias for transmission of channel data based on repair information and a number of channels of the semiconductor apparatus.

DETAILED DESCRIPTION

Hereinafter, a semiconductor apparatus according to the invention will be described below with reference to the accompanying figures through various embodiments.

Figure 1:
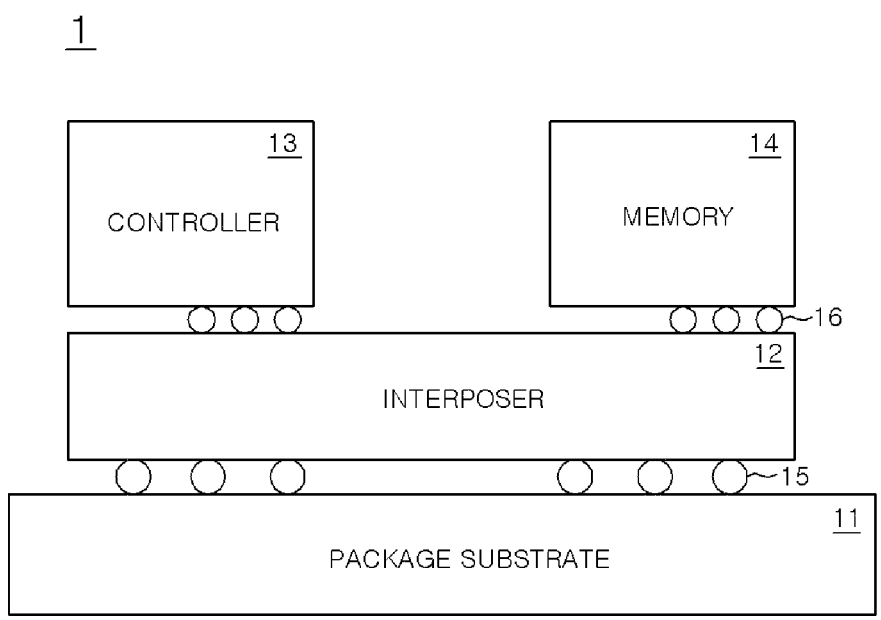
FIG. 1 is a schematic diagram illustrating a semiconductor system in accordance with an embodiment of the invention.

Referring to FIG. 1, the semiconductor system 1 may include a package substrate 11, an interposer substrate 12, a controller 13 and a memory 14. The interposer substrate 12 may be stacked on the package substrate 11. The interposer substrate 12 may be electrically coupled with the package substrate 11 through electrically coupling means 15 such as a bump ball, a ball grid array, a C4 bump, and so forth. The package substrate 11 and the interposer substrate 12 may have signal paths. The package substrate 11 may include a package ball. In addition, the semiconductor system 1 may be electrically coupled with an external device through the package ball.

The controller 13 and the memory 14 may be stacked on the interposer substrate 12, and may be electrically coupled with the interposer substrate 12 through a micro bump 16.

The controller 13 may communicate with the memory 14 through the signal paths of the interposer substrate 12. The elements of the semiconductor system 1 may be packaged in single package. The elements of the semiconductor system 1 may also be embodied in various forms such as a system on chip (SOC), a system in package (SIP), a multi-chip package, a flip-chip package, and so forth.

The controller 13 may be a master device to control the memory 14. The controller 13 may be one or more of a Central Processing Unit (CPU), a Graphic Processing Unit (GPU), a Digital Signal Processor (DSP), an application processor (AP), a controller chip, and a memory chip.

The memory 14 may be a slave to be controlled by the controller 13. The memory 14 may be a volatile memory apparatus like a dynamic random access memory (DRAM). Further, the memory 14 may include one or combination of non-volatile memory apparatuses including a flash memory device, a Phase Change Random Access Memory (PCRAM), a Resistive Random Access Memory (ReRAM), a Ferroelectric Random Access Memory (FeRAM), a Magnetic Random Access Memory (MRAM) and a Spin Transfer Torque Random Access Memory (STTRAM). In addition, the memory 14 may be combination of two or more of the volatile and non-volatile memory apparatuses. For example, the memory 14 may be a stack semiconductor apparatus including a plurality of chips.

Figure 2:
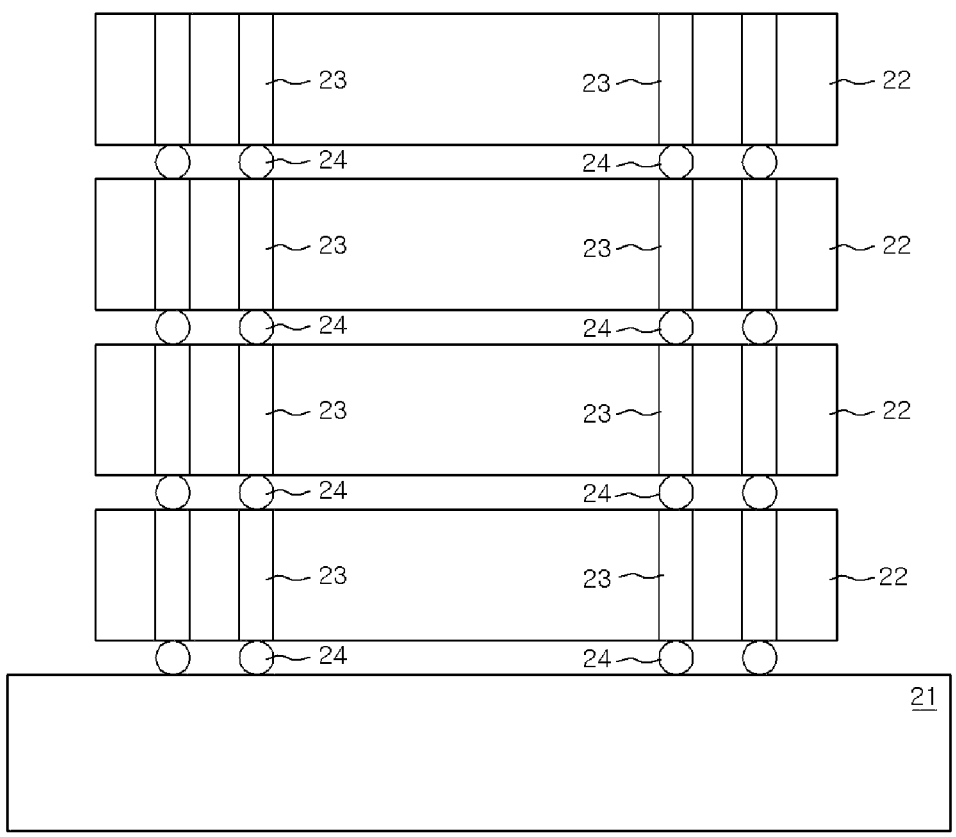
FIG. 2 is a schematic diagram illustrating a memory in accordance with an embodiment of the invention.

Referring to FIG. 2, a schematic diagram illustrating a memory 2 in accordance with an embodiment of the invention is shown. The memory 2 may correspond to the memory 14 described above with reference to FIG. 1. Referring once more to FIG. 2, the memory 2 may include a base chip 21 and a plurality of stacked chips 22. The plurality of stacked chips 22 may be sequentially stacked over the base chip 21. Each of the plurality of stacked chips 22 may include a through-via 23 formed therein, and may be electrically coupled with the base chip 21 through a micro bump 24 and the through-via 23. The plurality of stacked chips 22 may include a memory cell array to store data.

The base chip 21 may be electrically coupled with the controller 13 through the interposer substrate 12 described above with reference to FIG. 1. The base chip 21 may transfer a control signal from the controller 13 to the plurality of stacked chips 22. The base chip 21 may also transfer a signal from the plurality of stacked chips 22 to the controller 13. As an example, the base chip 21 may include circuitry to control the plurality of stacked chips 22, and a memory cell array to store data.

The memory 2 may include a plurality of independent channels. The plurality of independent channels may be means or medium capable of independently and simultaneously operate in response to different command, address, and data from one another. As an example, the plurality of stacked chips 22 may be the plurality of independent channels, respectively. The plurality of stacked chips 22 may include a plurality of through-vias so that data of the plurality of independent channels may be independently transferred.

Figure 3:
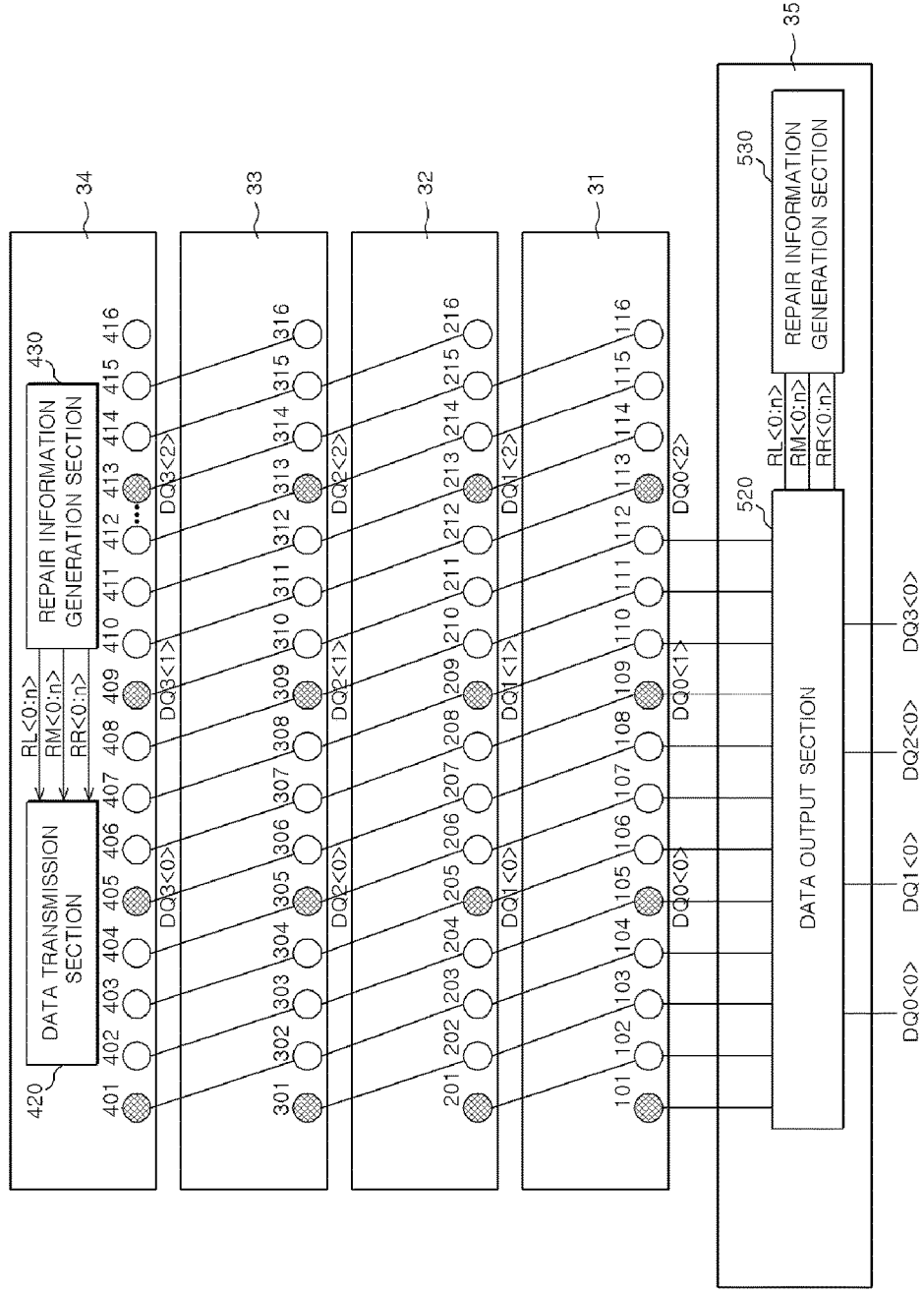
FIG. 3 is a schematic diagram illustrating a semiconductor apparatus in accordance with an embodiment of the invention.

Referring to FIG. 3, a schematic diagram illustrating a semiconductor apparatus 3 in accordance with an embodiment of the invention shown. The semiconductor apparatus 3 may include a plurality of stacked chips. The plurality of stacked chips may include a plurality of through-vias penetrating inside of the plurality of stacked chips. FIG. 3 provides a cross-sectional view for 4 numbers of stacked chips. FIG. 3 also provides plane view as a circle for each of the plurality of through-vias penetrating each of the plurality of stacked chips for the purpose of clear description for the semiconductor apparatus 3 in accordance with an embodiment of the invention. However, it is noted that the figure and the related description should not be construed to limit the planar shape of the plurality of through-vias. First to fourth stacked chips 31 to 34 may be stacked over one another. The second to fourth stacked chips 32 to 34 may be sequentially stacked on one another over the lowermost first stacked chip 31. The first to fourth stacked chips 31 to 34 may be electrically coupled with one another through the micro bump 24 disposed between the stacked chips 22 described above with reference to FIG. 2.

The first to fourth stacked chips 31 to 34 may include first to sixteenth through-vias 101 to 116, 201 to 216, 301 to 316, and 401 to 416, respectively. Although FIG. 3 shows 4 groups of the first to sixteenth through-vias 101 to 116, 201 to 216, 301 to 316, and 401 to 416 respectively corresponding to the first to fourth stacked chips 31 to 34 for clear description, the number of through-vias in each group may be various in each of the plurality of stacked chips. The first to sixteenth through-vias 101 to 116, 201 to 216, 301 to 316, and 401 to 416 in each group corresponding to each of the first to fourth stacked chips 31 to 34 may be disposed at corresponding locations in each of the first to fourth stacked chips 31 to 34. For example, as shown in FIG. 3, first through-vias 101, 201, 301, and 401 in each group of the first to sixteenth through-vias 101 to 116, 201 to 216, 301 to 316, and 401 to 416 may be vertically arranged in the first to fourth stacked chips 31 to 34. Similarly, the rest in each group of the first to sixteenth through-vias 101 to 116, 201 to 216, 301 to 316, and 401 to 416 may be vertically arranged in the first to fourth stacked chips 31 to 34. A certain through-via in each group of the first to sixteenth through-vias 101 to 116, 201 to 216, 301 to 316, and 401 to 416, or a certain through-via in each of the first to fourth stacked chips 31 to 34 may be electrically coupled with one of the through-vias in neighboring one of the first to fourth stacked chips 31 to 34 disposed in a diagonal direction. For instance, the first through-via 201 of the second stacked chip 32 may be electrically coupled with a second through-via 102 of the first stacked chip 31. In addition, the first through-via 301 of the third stacked chip 33 may be electrically and sequentially coupled with a second through-via 202 of the second stacked chip 32 and a third through-via 103 of the first stacked chip 31 which are disposed in the diagonal direction. Further, the first through-via 401 of the fourth stacked chip 34 may be electrically and sequentially coupled with a second through-via 302 of the third stacked chip 33, a third through-via 203 of the second stacked chip 32, and a fourth through-via 104 of the first stacked chip 31, which are disposed in the diagonal direction. In addition, a second through-via 402 of the fourth stacked chip 34 may be electrically and sequentially coupled with a third through-via 303 of the third stacked chip 33, a fourth through-via 204 of the second stacked chip 32, and a fifth through-via 105 of the first stacked chip 31, which are disposed in the diagonal direction. Further, a third through-via 403 of the fourth stacked chip 34 may be electrically and sequentially coupled with a fourth through-via 304 of the third stacked chip 33, a fifth through-via 205 of the second stacked chip 32, and a sixth through-via 106 of the first stacked chip 31, which are disposed in the diagonal direction. As described above, a certain through-via in each group of the first to sixteenth through-vias 101 to 116, 201 to 216, 301 to 316, and 401 to 416, or a certain through-via in each of the first to fourth stacked chips 31 to 34 may be electrically coupled with one of the through-vias in neighboring one of the first to fourth stacked chips 31 to 34 disposed in the diagonal direction.

For example, the electrical coupling of the through-vias may shift in right direction as the electrical coupling goes down from the uppermost fourth stacked chip 34 to the lowermost first stacked chip 31.

In an embodiment of the invention, each of the first through-vias 101, 201, 301, and 401, the fifth through-vias 105, 205, 305, and 405, the ninth through-vias 109, 209, 309, and 409, and thirteenth through-vias 113, 213, 313, and 413 in each of the first to fourth stacked chips 31 to 34 may have an input/output circuit. The input/output circuit may drive and transfer a signal generated by the first to fourth stacked chips 31 to 34, or a data outputted from the first to fourth stacked chips 31 to 34 through the corresponding through-via, and may transfer a signal, transmitted though the corresponding through-via, to the first to fourth stacked chips 31 to 34. Among the first to sixteenth through-vias 101 to 116, 201 to 216, 301 to 316, and 401 to 416, FIG. 3 shows the through-vias electrically coupled to the input/output circuits as mesh circles, and the other through-vias as blank circles. As described above, the first to sixteenth through-vias 101 to 116, 201 to 216, 301 to 316, and 401 to 416 may be electrically coupled with one another in the diagonal direction in the semiconductor apparatus 3. Accordingly, the input/output circuits need to be electrically coupled only with the first through-vias 101, 201, 301, and 401, the fifth through-vias 105, 205, 305, and 405, the ninth through-vias 109, 209, 309, and 409, and thirteenth through-vias 113, 213, 313, and 413 among the first to sixteenth through-vias 101 to 116, 201 to 216, 301 to 316, and 401 to 416 for data transmission/reception of the first to sixteenth through-vias 101 to 116, 201 to 216, 301 to 316, and 401 to 416, instead of the input/output circuits electrically coupled with all of the first to sixteenth through-vias 101 to 116, 201 to 216, 301 to 316, and 401 to 416.

The first to sixteenth through-vias 101 to 116, 201 to 216, 301 to 316, and 401 to 416 of the first to fourth stacked chips 31 to 34 may comprise a plurality of through-via arrays. Each of the plurality of through-via arrays may include a plurality of through-vias, a number of which corresponds to the number of channels. For example, first to fourth through-vias 101 to 104, 201 to 204, 301 to 304, 401 to 404 in each of the first to fourth stacked chips 31 to 34 may be a repair through-via array or a dummy through-via array. Further, fifth to sixteenth through-vias 105 to 116, 205 to 216, 305 to 316, and 405 to 416 in each of the first to fourth stacked chips 31 to 34 may be a plurality of normal through-via arrays. For example, the first to fourth stacked chips 31 to 34 may include more numbers of through-vias comprising the repair through-via array and the normal through-via array, which are alternately disposed. The normal through-via array may include the through-via basically designated as transferring data of the channels. Each of the plurality of through-via arrays may comprise single through-via electrically coupled to the input/output circuit, and 3 numbers of through-vias, which are not electrically coupled with the input/output circuits in the first to fourth stacked chips 31 to 34.

The first to fourth stacked chips 31 to 34 may form a first to fourth channels, respectively. The fifth through-via 105 of the first stacked chip 31 may output a first data DQ0<0> of the first channel. The ninth through-via 109 of the first stacked chip 31 may output a second data DQ0<1> of the first channel. The thirteenth through-via 113 of the first stacked chip 31 may output a third data DQ0<2> of the first channel. The fifth through-via 205 of the second stacked chip 32 may output a first data DQ1<0> of the second channel. The ninth through-via 209 of the second stacked chip 32 may output a second data DQ1<1> of the second channel. The thirteenth through-via 213 of the second stacked chip 32 may output a third data DQ1<2> of the second channel. The fifth through-via 305 of the third stacked chip 33 may output a first data DQ2<0> of the second channel. The ninth through-via 209 of the third stacked chip 33 may output a second data DQ2<1> of the second channel. The thirteenth through-via 213 of the third stacked chip 33 may output a third data DQ2<2> of the second channel. The fifth through-via 205 of the fourth stacked chip 34 may output a first data DQ3<0> of the second channel. The ninth through-via 209 of the fourth stacked chip 34 may output a second data DQ3<1> of the second channel. The thirteenth through-via 213 of the fourth stacked chip 34 may output a third data DQ3<2> of the second channel.

When a certain through-via included in the through-via array is defected, the semiconductor apparatus 3 may repair the through-via array including the defective through-via as a unit of repair. For example, when there is a defective through-via in the normal through-via array comprising the fifth to eighth through-vias 105 to 108, 205 to 208, 305 to 308, and 405 to 408 in each of the first to fourth stacked chips 31 to 34, the semiconductor apparatus 3 may repair the normal through-via array comprising the fifth to eighth through-vias 105 to 108, 205 to 208, 305 to 308, and 405 to 408 by shifting the electrical coupling of the normal through-via array comprising the fifth to eighth through-vias 105 to 108, 205 to 208, 305 to 308, and 405 to 408 left to the repair through-via array including, for example, the first to fourth through-vias 101 to 104, 201 to 204, 301 to 304, 401 to 404 in each of the first to fourth stacked chips 31 to 34, or right to another normal through-via array including, for example, the ninth to twelfth through-vias 109 to 112, 209 to 212, 309 to 312, and 409 to 412 in each of the first to fourth stacked chips 31 to 34. For the repair operation, each of the first to fourth stacked chips 31 to 34 may include a data transmission section 420. Although FIG. 3 shows the data transmission section 420 included in the fourth stacked chip 34, each of the other first to third stacked chips 31 to 33 may have the same data transmission section 420 as the fourth stacked chip 34. In accordance with an embodiment of the invention, the data transmission section 420 change the through-vias transferring channel data based on repair information. For example, the data transmission section 420 may output the first data DQ3<0> of the fourth channel to one of the first, fifth, and ninth through-vias 401, 405, and 409. Further, the data transmission section 420 may output the second data DQ3<2> of the fourth channel to one of the fifth, ninth, and thirteenth through-vias 405, 409, and 413. The data transmission section 420 may allow channel data to detour from the through-via, which is supposed to transfer the channel data but belongs to the through-via array including the defective through-via, through the through-via, which is electrically coupled with the input/output circuit, of the repair through-via array or another normal through-vial array disposed adjacent to the through-via supposed to transfer the channel data. The data transmission section 420 may output the third data DQ3<2> of the fourth channel to one of the ninth and thirteenth through-vias 409, and 413 and another through-via, which is electrically coupled with the input/output circuit, of the repair through-via array or another normal through-vial array disposed adjacent to the through-via supposed to transfer the third data DQ3<2> of the fourth channel.

Each of the first to fourth stacked chips 31 to 34 may include a repair information generation section 430. The repair information generation section 430 may provide the repair information to the data transmission section 420. Similar to a fuse array, a register, and so forth, the repair information generation section 430 may store information. The repair information generation section 430 may store repair information or defect information of the first to sixteenth through-vias 101 to 116, 201 to 216, 301 to 316, and 401 to 416. The repair information generation section 430 may generate first to third control signals RL<0:n>, RM<0:n>, and RR<0:n> based on the repair information. In addition, the data transmission section 420 may select one of the first to sixteenth through-vias 101 to 116, 201 to 216, 301 to 316, and 401 to 416 for transmission of the channel data in response to the first to third control signals RL<0:n>, RM<0:n>, and RR<0:n>. For example, the second control signal RM<0:n> may represent order to the data transmission section 420 not to change the through-via for the transmission of the channel data. The first control signal RL<0:n> may represent order to the data transmission section 420 to select one of the first to sixteenth through-vias 101 to 116, 201 to 216, 301 to 316, and 401 to 416 disposed in the right side of the through-via originally supposed to transfer the channel data. Further, the third control signal RR<0:n> may represent order to the data transmission section 420 to select one of the first to sixteenth through-vias 101 to 116, 201 to 216, 301 to 316, and 401 to 416 disposed in left side of the through-via originally supposed to transfer the channel data. For example, when the second control signal RM<0:n> is enabled on the basis of the repair information, the data transmission section 420 may transmit the first data DQ3<0> of the fourth channel through the fifth through-via 405 of the fourth stacked chip 34. When the first control signal RL<0:n> is enabled on the basis of the repair information, the data transmission section 420 may transmit the first data DQ3<0> of the fourth channel through the ninth through-via 409 of the fourth stacked chip 34, which is disposed in the right side of the fifth through-via 405 originally supposed to transfer the first data DQ3<0> of the fourth channel. When the third control signal RR<0:n> is enabled on the basis of the repair information, the data transmission section 420 may transmit the first data DQ3<0> of the fourth channel through the first through-via 401 of the fourth stacked chip 34, which is disposed in the left side of the fifth through-via 405 originally supposed to transfer the first data DQ3<0> of the fourth channel.

The data transmission section 420 may select one of the first to sixteenth through-vias 101 to 116, 201 to 216, 301 to 316, and 401 to 416 for transmission of the channel data in various ways. For example, when one of the ninth to twelfth through-vias 109 to 112, 209 to 212, 309 to 312, 409 to 412 of the normal through-via array for transmission of the second data DQ0<1>, DQ1<1>, DQ2<1>, and DQ3<1> of the first to fourth channels is defective, the data transmission section 420 may output the first data DQ3<0> of the fourth channel through the first through-via 401, the second data DQ3<1> of the fourth channel through the fifth through-via 409, and third data DQ3<2> of the fourth channel through the thirteenth through-via 413. Further, when one of the ninth to twelfth through-vias 109 to 112, 209 to 212, 309 to 312, 409 to 412 of the normal through-via array for transmission of the second data DQ0<1>, DQ1<1>, DQ2<1>, and DQ3<1> of the first to fourth channels is defective and one of the thirteenth to sixteenth through-vias 113 to 116, 213 to 216, 313 to 316, and 413 to 416 of the normal through-via array for transmission of the third data DQ0<2>, DQ1<2>, DQ2<2>, DQ3<2> of the first to fourth channels is defective, the data transmission section 420 may output the first data DQ3<0> of the fourth channel through the first through-via 401, the second data DQ3<1> of the fourth channel through the thirteenth through-via 413, and third data DQ3<2> of the fourth channel through another through-via disposed in the right side of the sixteenth through-via 416.

Each of the first to third stacked chips 31 to 33 may include the same data transmission section 420 and the same repair information generation section 430 as the fourth stacked chip 34. The repair information stored in the repair information generation section 430 of the first to third stacked chips 31 to 33 may be the same as the fourth stacked chip 34. Therefore, the data transmission section 420 of the first to third stacked chips 31 to 33 may perform the same operation as the fourth stacked chip 34. With such elements, the semiconductor apparatus 3 in accordance with an embodiment of the invention may repair the defective through-via by shifting the electrical coupling of the defective through-via by the unit of the through-via array of the channel.

Referring again to FIG. 3, the semiconductor apparatus 3 may further include a base chip 35. The base chip 35 may receive data transmitted from the first to fourth stacked chips 31 to 34. The base chip 35 may include a data output section 520. The data output section 520 may be electrically coupled with one of the fifth to sixteenth through-vias 105 to 116 based on the repair information for data reception. The data output section 520 and the data transmission section 420 may receive the same repair information. The data output section 520 may receive the channel data by selecting the through-via included one of the plurality of the through-via arrays transferring the channel data of the first to fourth stacked chips 31 to 34 based on the repair information. For example, the data output section 520 may output the channel data transferred through one of the first, fifth, and ninth through-vias 101, 105, and 109 of the first stacked chip 31 as the first data DQ0<0> of the first channel based on the repair information. For example, the data output section 520 may output the channel data transferred through one of the second, sixth, and tenth through-vias 102, 106, and 110 of the first stacked chip 31, which are electrically coupled to the first, fifth, and ninth through-vias 201, 205, and 209 of the second stacked chip 32 respectively, as the first data DQ1<0> of the second channel based on the repair information. For instance, the data output section 520 may output the channel data transferred through one of the third, seventh, and the eleventh through-vias 103, 107, and 111 of the first stacked chip 31, which are electrically coupled to the first, fifth, and ninth through-vias 301, 305, and 309 of the third stacked chip 33 respectively, as the first data DQ2<0> of the third channel based on the repair information. For instance, the data output section 520 may output the channel data transferred through one of the fourth, eighth, and twelfth through-vias 104, 108, and 112 of the first stacked chip 31, which are electrically coupled to the first, fifth, and ninth through-vias 401, 405, and 409 of the fourth stacked chip 34 respectively, as the first data DQ3<0> of the fourth channel based on the repair information. When the first data DQ1<0>, DQ1<0>, DQ2<0>, and DQ3<0> of the first to fourth channels are transferred through the first through-vias 101, 201, 301, and 401 in each of the first to fourth stacked chips 31 to 34 by the data transmission section 420, the data output section 520 may receive the first data DQ1<0>, DQ1<0>, DQ2<0>, and DQ3<0> of the first to fourth channels through the first to fourth through-vias 101 to 104 in the first stacked chip 31. The data output section 520 may also output the first data DQ1<0>, DQ1<0>, DQ2<0>, and DQ3<0> of the first to fourth channels as the channel data of the first to fourth channels. The base chip 35 may further include the repair information generation section 530, which may provide the repair information to the data output section 520 and may generate the first to third control signals RL<0:n>, RM<0:n>, and RR<0:n> based on the repair information.

Figure 4:
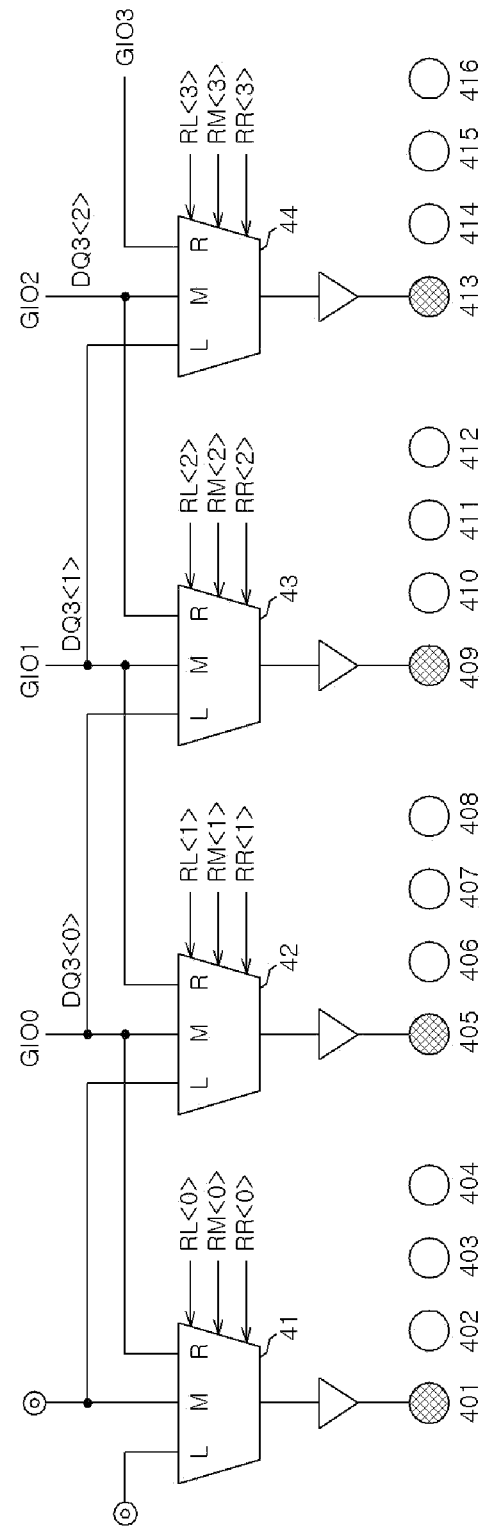
FIG. 4 is a circuit diagram illustrating a data transmission section shown in FIG. 3.

Referring to FIG. 4, a circuit diagram illustrating the data transmission section 420 shown in FIG. 3 is described. Referring to FIG. 4, the data transmission section 420 may include a plurality of transmission selection units 41 to 44. The plurality of transmission selection units 41 to 44 may be provided for the plurality of through-via arrays, respectively. For example, the first transmission selection unit 41 may be electrically coupled with the first through-via 401, which is one of the first to fourth through-vias 401 to 404 included in the repair through-via array and which is electrically coupled with the input/output circuit. For instance, the second transmission selection unit 42 may be electrically coupled with the fifth through-via 405, which is one of the fifth to eighth through-vias 405 to 408 included in the normal through-via array and which is electrically coupled with the input/output circuit. For example, the third transmission selection unit 43 may be electrically coupled with the ninth through-via 409, which is one of the ninth to twelfth through-vias 409 to 412 included in the normal through-via array and which is electrically coupled with the input/output circuit. For instance, the fourth transmission selection unit 44 may be electrically coupled with the thirteenth through-via 413, which is one of the thirteenth to sixteenth through-vias 413 to 416 included in the normal through-via array and which is electrically coupled with the input/output circuit. Each of the plurality of transmission selection units 41 to 44 may receive corresponding ones of the first to third control signals RL<0:n>, RM<0:n>, and RR<0:n>.

The first transmission selection unit 41 may be electrically coupled with a floating node at its first and second input terminals. The first transmission selection unit 41 may also be electrically coupled with a first data transmission line GIO0, which transfers the first data DQ3<0>, at its third terminal. The second transmission selection unit 42 may be electrically coupled with the floating node at its first input terminal. The second transmission selection unit 42 may also be electrically coupled with the first data transmission line GIO0 at its second terminal. Further, the second transmission selection unit 42 may also be electrically coupled with a second data transmission line GIO1, which transfers the second data DQ3<1>, at its third terminal. The third transmission selection unit 43 may be electrically coupled with the first transmission line GIO0 at its first input terminal. The third transmission selection unit 43 may also be electrically coupled with the second data transmission line GIO1 at its second terminal. Further, the third transmission selection unit 43 may also be electrically coupled with a third data transmission line GIO2, which transfers the third data DQ3<2>, at its third terminal. The fourth transmission selection unit 44 may be electrically coupled with the second transmission line GIO1 at its first input terminal. The fourth transmission selection unit 44 may also be electrically coupled with the third data transmission line GIO2 at its second terminal. Further, the fourth transmission selection unit 44 may also be electrically coupled with a fourth data transmission line GIO3, which transfers the fourth data, at its third terminal. Each of the data transmission lines GIO0 to GIO3 may transfer stored data from the first to fourth stacked chips 31 to 34, or data to the first to fourth stacked chips 31 to 34.

When all of the second control signal RM<0:3> is enabled, the first transmission selection unit 41 may electrically couple the first through-via 401 with the floating node thereby outputting no signal through the first through-via 401. The second transmission selection unit 42 may electrically couple the fifth through-via 405 with the first data transmission line GIO0 thereby outputting the first data DQ3<0> through the fifth through-via 405. The third transmission selection unit 43 may electrically couple the ninth through-via 409 with the second data transmission line GIO1 thereby outputting the second data DQ3<1> through the ninth through-via 409. The fourth transmission selection unit 44 may electrically couple the thirteenth through-via 413 with the third data transmission line GIO2 thereby outputting the third data DQ3<2> through the thirteenth through-via 413.

When all of the first control signal RL<0:3> is enabled, the first transmission selection unit 41 may electrically couple the first through-via 401 with the floating node thereby outputting no signal through the first through-via 401. The second transmission selection unit 42 may electrically couple the fifth through-via 405 with the floating node thereby outputting no signal through the fifth through-via 405. The third transmission selection unit 43 may electrically couple the ninth through-via 409 with the first data transmission line GIO0 thereby outputting the first data DQ3<0> through the ninth through-via 409. The fourth transmission selection unit 44 may electrically couple the thirteenth through-via 413 with the second data transmission line GIO1 thereby outputting the second data DQ3<1> through the thirteenth through-via 413.

When the third control signal RR<0:3> is enabled, the first transmission selection unit 41 may electrically couple the first through-via 401 with the first data transmission line GIO0 thereby outputting the first data DQ3<0> through the first through-via 401. The second transmission selection unit 42 may electrically couple the fifth through-via 405 with the second data transmission line GIO1 thereby outputting the second data DQ3<1> through the fifth through-via 405. The third transmission selection unit 43 may electrically couple the ninth through-via 409 with the third data transmission line GIO2 thereby outputting the third data DQ3<2> through the ninth through-via 409. The fourth transmission selection unit 44 may electrically couple the thirteenth through-via 413 with the fourth data transmission line GIO3 thereby outputting the fourth data through the thirteenth through-via 413.

As described above, the data transmission section 420 may select one of the first to sixteenth through-vias 101 to 116, 201 to 216, 301 to 316, and 401 to 416 for transmission of the channel data in response to the first to third control signals RL<0:n>, RM<0:n>, and RR<0:n>. When the second control signal RM<0:3> is enabled, the data transmission section 420 may electrically couple the first to fourth data transmission lines GIO0 to GIO3 with the through-vias originally supposed to transfer the channel data. When the first control signal RL<0:3> is enabled, the data transmission section 420 may electrically couple the first to fourth data transmission lines GIO0 to GIO3 with the through-vias included in the through-via array disposed in the right side of the through-vias originally supposed to transfer the channel data. When the third control signal RR<0:3> is enabled, the data transmission section 420 may electrically couple the first to fourth data transmission lines GIO0 to GIO3 with the through-vias included in the through-via array disposed in the left side of the through-vias originally supposed to transfer the channel data.

Figure 5:
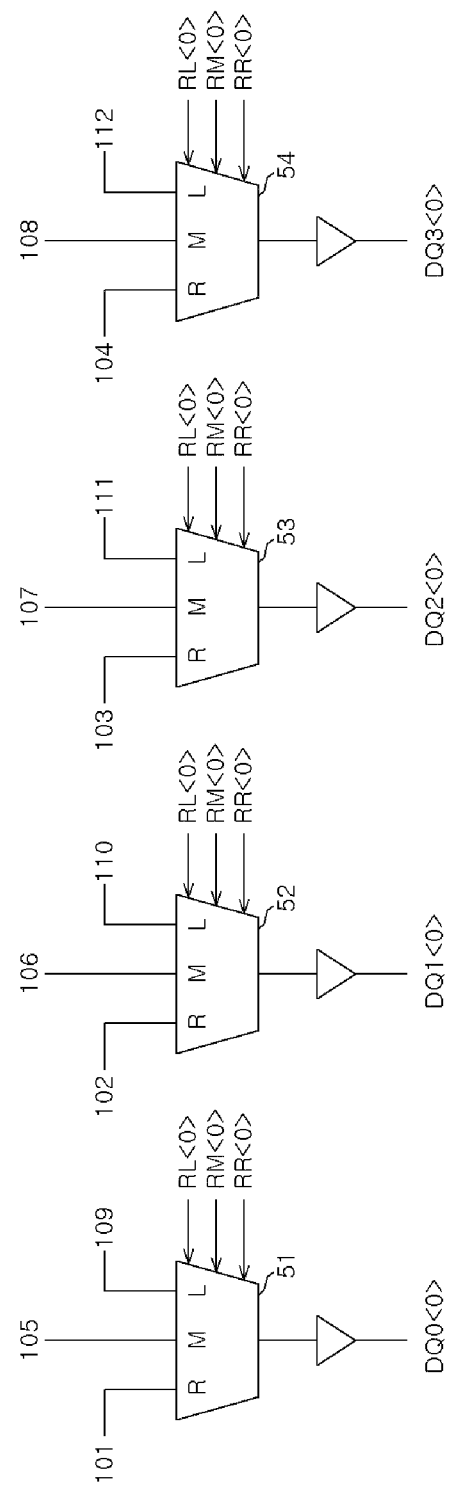
FIG. 5 is a circuit diagram illustrating a data output section shown in FIG. 3.

Referring to FIG. 5, a circuit diagram illustrating the data output section 520 shown in FIG. 3 is described. The data output section 520 may include a plurality of output selection units 51 to 54, a number of which corresponds to a number of data and a number of the channels. For example, the first output selection unit 51 may be electrically coupled with the first, fifth, and ninth through-vias 101, 105, and 109 of the first stacked chip 31. The second output selection unit 52 may be electrically coupled with the second, sixth, and tenth through-vias 102, 106, and 110 of the first stacked chip 31. The third output selection unit 53 may be electrically coupled with the third, seventh, and the eleventh through-vias 103, 107, and 111 of the first stacked chip 31. The fourth output selection unit 54 may be electrically coupled with the fourth, eighth, and twelfth through-vias 104, 108, and 112 of the first stacked chip 31. Each of the plurality of output selection units 51 to 54 may receive corresponding ones of the first to third control signals RL<0:n>, RM<0:n>, and RR<0:n>. FIG. 4 illustrates the plurality of output selection units 51 to 54 capable of outputting the first data DQ0<0>, DQ1<0>, DQ2<0>, and DQ3<0> of the first to fourth channels. The plurality of output selection units 51 to 54 may commonly receive the first to third control signals RL<0>, RM<0>, and RR<0>.

When the second control signal RM<0> is enabled, the first output selection unit 51 may be electrically coupled with the fifth through-via 105 thereby outputting data transferred through the fifth through-via 105 as the first data DQ0<0> of the first channel. The second output selection unit 52 may be electrically coupled with the sixth through-via 106 thereby outputting data transferred through the fifth through-via 205 of the second stacked chip 31 electrically coupled with the sixth through-via 106 as the first data DQ1<0> of the second channel. The third output selection unit 53 may be electrically coupled with the seventh through-via 107 thereby outputting data transferred through the fifth through-via 305 of the third stacked chip 33 electrically coupled with the seventh through-via 107 as the first data DQ2<0> of the third channel. The fourth output selection unit 54 may be electrically coupled with the eighth through-via 108 thereby outputting data transferred through the fifth through-via 405 of the fourth stacked chip 34 electrically coupled with the eighth through-via 108 as the first data DQ3<0> of the fourth channel.

When the third control signal RR<0> is enabled, the first output selection unit 51 may be electrically coupled with the first through-via 101 thereby outputting data transferred through the first through-via 101 as the first data DQ0<0> of the first channel. The second output selection unit 52 may be electrically coupled with the second through-via 102 thereby outputting data transferred through the first through-via 201 of the second stacked chip 31 electrically coupled with the second through-via 102 as the first data DQ1<0> of the second channel. The third output selection unit 53 may be electrically coupled with the third through-via 103 thereby outputting data transferred through the first through-via 301 of the third stacked chip 33 electrically coupled with the third through-via 103 as the first data DQ2<0> of the third channel. The fourth output selection unit 54 may be electrically coupled with the fourth through-via 104 thereby outputting data transferred through the first through-via 401 of the fourth stacked chip 34 electrically coupled with the fourth through-via 104 as the first data DQ3<0> of the fourth channel.

When the first control signal RL<0> is enabled, the first output selection unit 51 may be electrically coupled with the ninth through-via 109 thereby outputting data transferred through the ninth through-via 109 as the first data DQ0<0> of the first channel. The second output selection unit 52 may be electrically coupled with the tenth through-via 110 thereby outputting data transferred through the ninth through-via 209 of the second stacked chip 31 electrically coupled with the tenth through-via 110 as the first data DQ1<0> of the second channel. The third output selection unit 53 may be electrically coupled with the eleventh through-via 111 thereby outputting data transferred through the ninth through-via 309 of the third stacked chip 33 electrically coupled with the eleventh through-via 111 as the first data DQ2<0> of the third channel. The fourth output selection unit 54 may be electrically coupled with the twelfth through-via 112 thereby outputting data transferred through the ninth through-via 409 of the fourth stacked chip 34 electrically coupled with the twelfth through-via 112 as the first data DQ3<0> of the fourth channel. Therefore, the data output section 520 may receive corresponding channel data through the through-via selected in response to the first to third control signals RL<0>, RM<0>, and RR<0>.

Operation of the semiconductor apparatus 3 will be described with reference to FIGS. 3 to 5. When there is a defective through-via in the normal through-via array comprising the fifth to eighth through-vias 105 to 108, 205 to 208, 305 to 308, and 405 to 408 in each of the first to fourth stacked chips 31 to 34, the semiconductor apparatus 3 may repair the normal through-via array comprising the fifth to eighth through-vias 105 to 108, 205 to 208, 305 to 308, and 405 to 408 by replacing the normal through-via array comprising the fifth to eighth through-vias 105 to 108, 205 to 208, 305 to 308, and 405 to 408 with the repair through-via array including, for example, the first to fourth through-vias 101 to 104, 201 to 204, 301 to 304, 401 to 404 in each of the first to fourth stacked chips 31 to 34. The repair information generation section 430 may enable the third control signal RR<0> among the first to third control signal RL<0:n>, RM<0:n>, and RR<0:n>, which the first transmission selection unit 41 receives, based on the repair information. The repair information generation section 430 may disable all of the first control signal RL<1>, RM<1>, and RR<1> among the first to third control signal RL<0:n>, RM<0:n>, and RR<0:n>, which the second transmission selection unit 42 receives, based on the repair information. The repair information generation section 430 may enable the second control signal RL<2>, RM<2>, and RR<2> among the first to third control signal RL<0:n>, RM<0:n>, and RR<0:n>, which the third and fourth transmission selection units 43 and 44 receive, based on the repair information. The first transmission selection unit 41 may electrically couple the first through-via 401 with the first data transmission line GIO0 in response to the third control signal RR<0> thereby outputting the first data DQ3<0> through the first through-via 401. The second transmission selection unit 42 may output no signal through the fifth through-via 405 in response to the disabled first to third control signals. The third and fourth transmission selection units 43 and 44 may electrically couple the ninth and thirteenth through-vias 409 and 413 with the second and third data transmission lines GIO1 and GIO2 in response to the second control signals RM<2> and RM<3>, respectively.

The first data DQ3<0> of the fourth channel may be inputted to the fourth output selection unit 54 sequentially through the first through-via 401 of the fourth stacked chip 34, the second through-via 302 of the third stacked chip 33, the third through-via 203 of the second stacked chip 32, and the fourth through-via 104 of the first stacked chip 31. Similar to the fourth stacked chip 34, the first data transmission line GIO0 may be electrically coupled with the first through-via 301 of the third stacked chip 33. The first data DQ2<0> of the third channel may be inputted to the third output selection unit 53 sequentially through the second through-via 202 of the second stacked chip 32, and the third through-via 103 of the first stacked chip 31. The first data transmission line GIO0 may be electrically coupled with the first through-via 201 of the second stacked chip 32, the first data DQ1<0> of the second channel may be inputted to the second output selection unit 52 sequentially through the second through-via 102 of the first stacked chip 31. The first data transmission line GIO0 may be electrically coupled with the first through-via 101 of the first stacked chip 31. The first data DQ0<0> of the first channel may be inputted to the first output selection unit 51 sequentially through the first through-via 101 of the first stacked chip 31.

The plurality of output selection units 51 to 54 may receive the control signals RL<0>, RM<0>, and RR<0>, which the first transmission selection unit 41 receives, in response to the repair information. The first output selection unit 51 may output the signal transferred through the first through-via 101 as the first data DQ0<0> of the first channel in response to the enabled third control signal RR<0>. The second output selection unit 52 may output the signal transferred through the second through-via 102 as the first data DQ1<0> of the second channel in response to the enabled third control signal RR<0>. The third and fourth output selection units 53 and 54 may output the signals transferred through the third and fourth through-vias 103 and 104 as the first data DQ2<0> and DQ3<0> of the third and fourth channels in response to the enabled third control signal RR<0>, respectively. Therefore, the data transmission section 420 may transfer the first data DQ0<0>, DQ1<0>, DQ2<0>, and DQ3<0> of the first to fourth channels, which are transmitted through the fifth through-vias 105, 205, 305, and 405, through the first through-vias 101, 201, 301, and 401. In addition, the data output section 520 may receive the first data DQ0<0>, DQ1<0>, DQ2<0>, and DQ3<0> of the first to fourth channels through the first to fourth through-vias 101 to 104 of the first stacked chip 31. Although the above description shows part of operation of the semiconductor apparatus 3 in accordance with an embodiment of the invention, those skilled in the art may understand that the semiconductor apparatus 3 described above with reference to FIGS. 1 to 5 may perform operation with the above-described elements in various ways. For example, when there occurs a defective through-via in the normal through-via array comprising the fifth to eighth through-vias 105 to 108, 205 to 208, 305 to 308, and 405 to 408 in each of the first to fourth stacked chips 31 to 34, the first data transmission line GIO0 may be electrically coupled with the ninth through-via 409. In addition, the second data transmission line GIO1 may be electrically coupled with the thirteenth through-via 413. Therefore, the first and second data DQ3<0>, and DQ3<1> may detour through the through-via arrays in the right side of the normal through-via array including the defective through-via, respectively.

Figure 6:
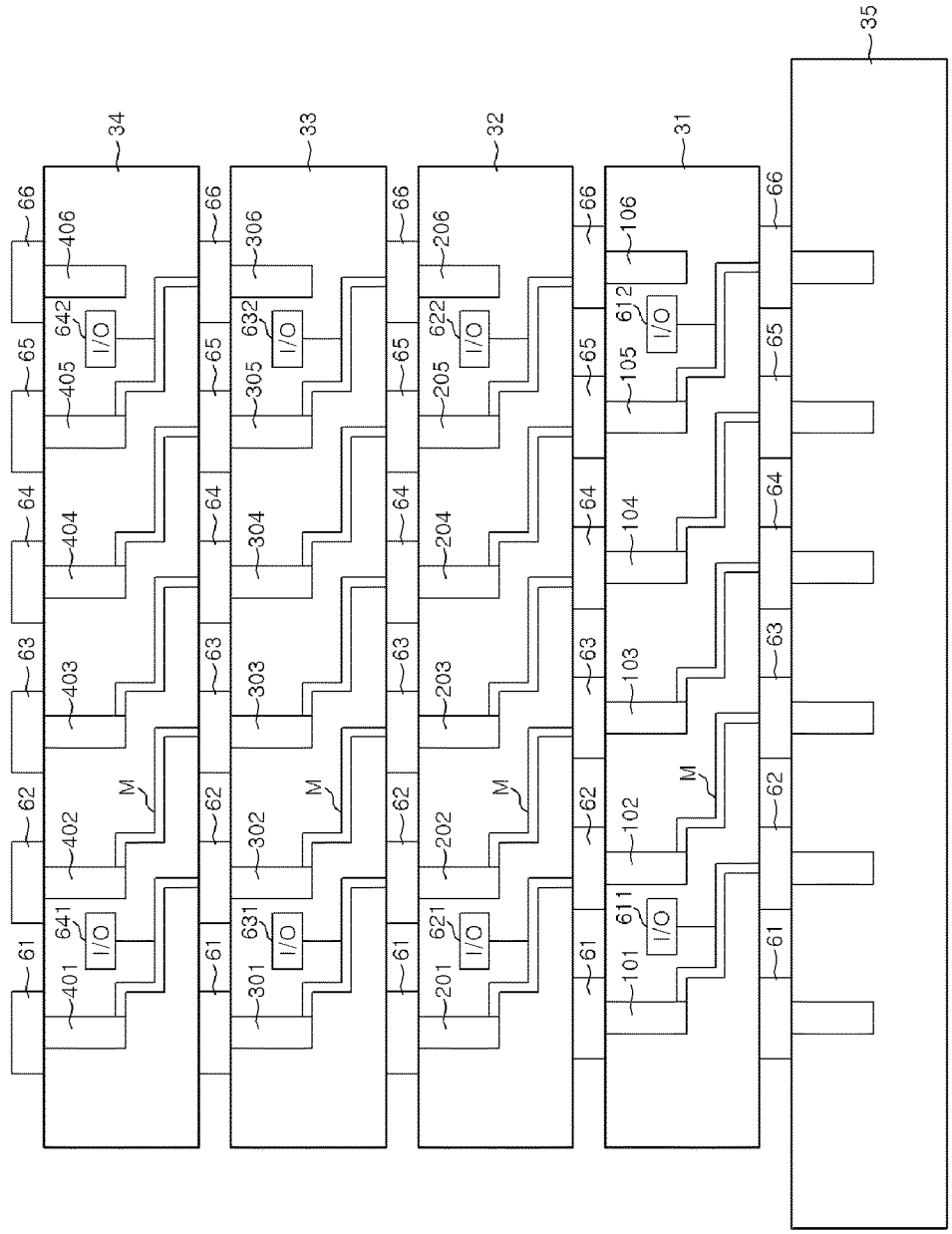
FIG. 6 is a cross-sectional diagram illustrating stacked chips of a semiconductor apparatus shown in FIG. 3.

Referring to FIG. 6, a cross-sectional diagram illustrating stacked chips of the semiconductor apparatus 3 shown in FIG. 3 is described. FIG. 6 illustrates the first to fourth stacked chips 31 to 34, the base chip 35, and the first to sixth through-vias 101 to 106, 201 to 206, 301 to 306, and 401 to 406 disposed over the base chip 35. The first to fourth stacked chips 31 to 34 and the base chip 35 may be stacked through the instrumentality of micro bumps 61 to 66. The first to sixth through-vias 101 to 106, 201 to 206, 301 to 306, and 401 to 406 of the first to fourth stacked chips 31 to 34 may be formed by penetrating the first to fourth stacked chips 31 to 34. Further, as shown in FIG. 6, the first to sixth through-vias 101 to 106, 201 to 206, 301 to 306, and 401 to 406 may penetrate a part of the first to fourth stacked chips 31 to 34. In general, a metal line M may electrically couple the first through-vias 101, 201, 301, and 401 in each of the first to fourth stacked chips 31 to 34 by electrically coupling the first through-via 101 with the micro bump 60, which is vertically aligned with the first through-vias 101, 201, 301, and 401. In accordance with an embodiment of the invention, the metal line M may be formed so that one of the first to sixth through-vias 101 to 106, 201 to 206, 301 to 306, and 401 to 406 may be electrically coupled with the micro bump, which is disposed in the diagonal direction between the adjacent stacked chips among the first to fourth stacked chips 31 to 34. Through the metal line M, the first through-via 401 of the fourth stacked chip 34 may be electrically coupled with the micro bump 62 between the fourth stacked chip 34 and the third stacked chip 33, and therefore electrically coupled with the second through-via 302 of the third stacked chip 33. Through the metal line M, the second through-via 302 of the third stacked chip 33 may be electrically coupled with the micro bump 62 between the third stacked chip 33 and the second stacked chip 32, and therefore electrically coupled with the third through-via 203 of the second stacked chip 32. Through the metal line M, the third through-via 203 of the second stacked chip 32 may be electrically coupled with the micro bump 62 between the second stacked chip 32 and the first stacked chip 31, and therefore electrically coupled with the fourth through-via 104 of the first stacked chip 31. Through the coupling relationship of the through-vias and the metal line described above, one of the first to sixth through-vias 101 to 106, 201 to 206, 301 to 306, and 401 to 406 in each of the first to fourth stacked chips 31 to 34 may be electrically coupled with another one of the through-vias disposed in the diagonal direction on the neighboring stacked chip.

Since the first to sixth through-vias 101 to 106, 201 to 206, 301 to 306, and 401 to 406 of the semiconductor apparatus 3 are electrically coupled with one another in the diagonal direction, first one of each of the plurality of through-via arrays may include the input/output circuit. For example, the first to fourth through-vias 101 to 104, 201 to 204, 301 to 304, and 401 to 404 in each of the first to fourth stacked chips 31 to 34 may form single through-via array. Further, only the first through-vias 101, 201, 301, and 401 of each of the first to fourth stacked chips 31 to 34 may be electrically coupled with the input/output circuits 611, 621, 631, and 641, respectively. The fifth and sixth through-vias 105 to 106, 205 to 206, 305 to 306, 405 to 406 in each of the first to fourth stacked chips 31 to 34 may form another through-via array. In addition, only the fifth through-vias 105, 205, 305, and 405 may be electrically coupled with the input/output circuits 612, 622, 632, and 642.

Figure 7:
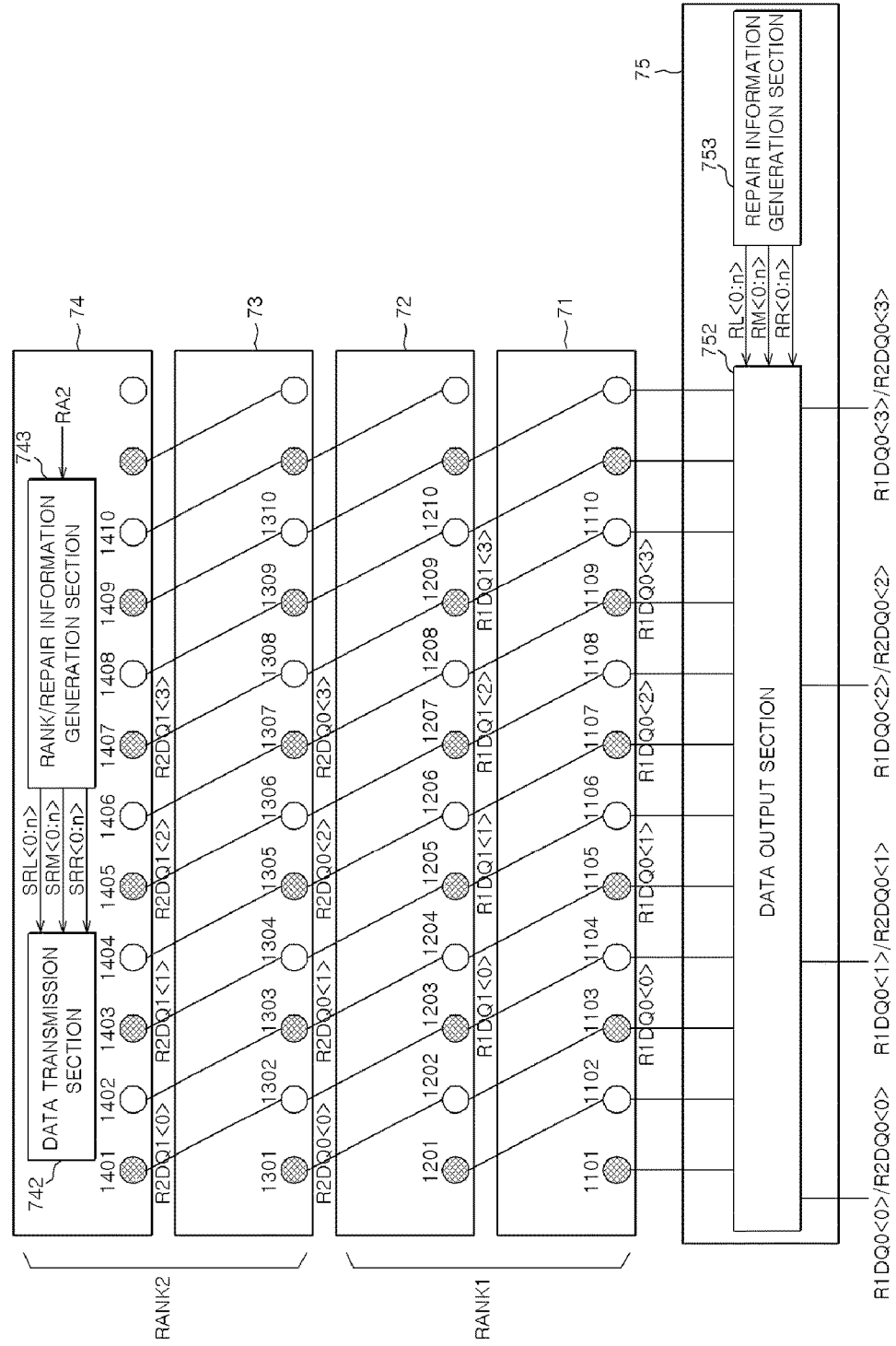
FIG. 7 is a schematic diagram illustrating a semiconductor apparatus in accordance with an embodiment of the invention.

Referring to FIG. 7, a schematic diagram illustrating a semiconductor apparatus 4 in accordance with an embodiment of the invention is described. Referring to FIG. 7, the semiconductor apparatus 4 may be similar to the semiconductor apparatus 3 described above with reference to FIGS. 1 to 6. The semiconductor apparatus 4 may include first to fourth stacked chips 71 to 74, a base chip 75, and a plurality of through-vias disposed on the first to fourth stacked chips 71 to 74. Each of the plurality of through-vias may be electrically coupled with one another in the diagonal direction. The semiconductor apparatus 4 may include two channels. In addition, the semiconductor apparatus 4 may include two ranks. The first and second stacked chips 71 and 72, which may be stacked in relatively lower part, may form a first rank RANK1. In addition, the third and fourth stacked chips 73 and 74, which may be stacked in relatively upper part, may form a second rank RANK2. The plural ranks may not operate simultaneously with each other. The plural ranks may commonly receive a command signal, an address signal, and data, while only selected one of the plural ranks may operate in response to the received command signal, address signal, and data. Therefore, the plural ranks may share a channel with each other due to single operation of one of the plural ranks at a time. In accordance with an embodiment of the invention, the first rank RANK1 and the second rank RANK2 may share first and second channels.

For example, first and second through-vias 1101 to 1102, 1201 to 1202, 1301 to 1302, and 1401 to 1402 in each of the first to fourth stacked chips 71 to 74 may be the repair through-via array. Further, third to tenth through-vias 1103 to 1110, 1203 to 1210, 1303 to 1310, and 1403 to 1410 in each of the first to fourth stacked chips 71 to 74 may be the plurality of normal through-via arrays. The semiconductor apparatus 4 may operate with the two channels. The first to fourth stacked chips 71 to 74 may have the same structure as one another. Moreover, the first one of each of the plurality of through-via arrays may be electrically coupled with the input/output circuit. Therefore, the first, third, fifth, seventh, and ninth through-vias 1101, 1103, 1105, 1107, and 1109, 1201, 1203, 1205, 1207, and 1209, 1301, 1303, 1305, 1307, and 1309, and 1401, 1403, 1405, 1407, and 1409 in each of the first to fourth stacked chips 71 to 74 may be electrically coupled with the input/output circuits, respectively. Therefore, generally the third, fifth, seventh, and ninth through-vias 1103, 1105, 1107, and 1109 in the first stacked chip 71 form the first channel of the first rank RANK1. In addition, the third, fifth, seventh, and ninth through-vias 1203, 1205, 1207, and 1209 in the second stacked chip 72 form the second channel of the first rank RANK1. Further, generally the third, fifth, seventh, and ninth through-vias 1303, 1305, 1307, and 1309 in the third stacked chip 73 form the first channel of the second rank RANK2. In addition, the third, fifth, seventh, and ninth through-vias 1403, 1405, 1407, and 1409 in the fourth stacked chip 74 form the second channel of the second rank RANK2.

The plurality of through-vias electrically coupled with one another in the diagonal direction in the semiconductor apparatus 4 may have a problem that the first and second ranks RANK1 and RANK2 cannot share the channels. In accordance with an embodiment of the invention, the semiconductor apparatus 4 may allow the first and second ranks RANK1 and RANK2 by allowing a signal transferred through the through-vias of the third and fourth stacked chips 73 and 74 included in the second rank RANK2. Each of the first to fourth stacked chips 71 to 74 may include a data transmission section 742 and a rank/repair information generation section 743. FIG. 7 representatively shows the data transmission section 742 and the rank/repair information generation section 743 included in the fourth stacked chip 74. The data transmission section 742 may select one of the plurality of through-vias for transmission of the channel data in response to the first to third selection control signals SRL<0:n>, SRM<0:n>, and SRR<0:n> outputted from the rank/repair information generation section 743. In contrast from the repair information generation section 430, the rank/repair information generation section 743 may further receive a rank signal. The rank/repair information generation section 743 included in each of the first and second stacked chip 71 and 72 may receive a first rank information signal. In addition, the rank/repair information generation section 743 included in the third and fourth stacked chip 73 and 74 may receive a second rank information signal. For example, the first rank information signal may be a signal of a low level, and the second rank information signal RA2 may be a signal of a high level. The rank/repair information generation section 743 will be described in detail later.

The data transmission section 742 included in each of the third and fourth stacked chips 73 and 74 may sequentially transfer the data to be outputted from the third and fourth stacked chips 73 and 74 from the repair through-via array. For example, when four data is outputted through the first and second channels, the data transmission section 742 in each of the first and second stacked chips 71 and 72 may output the first data R1DQ0<0> and R1DQ1<0> of the first and second channels through the third through-vias 1103 and 1203, respectively, output the second data R1DQ0<1> and R1DQ1<1> of the first and second channels through the fifth through-vias 1105 and 1205, respectively, and output the third and fourth data R1DQ0<2:3> and R1DQ1<2:3> of the first and second channels through the seventh and ninth through-vias 1107 and 1109, and 1207 and 1209, respectively. The data transmission section 742 in each of the third and fourth stacked chips 73 and 74 may output the first data R2DQ0<0> and R2DQ1<0> of the first and second channels through the first through-vias 1301 and 1401, respectively. The data transmission section 742 may also output the second data R2DQ0<1> and R2DQ1<1> of the first and second channels through the third through-vias 1303 and 1403, respectively. Further, the data transmission section 742 may output the third and fourth data R2DQ0<2:3> and R2DQ1<2:3> of the first and second channels through the fifth and seventh through-vias 1305 and 1307, and 1405 and 1407, respectively.

Since the plurality of through-vias are electrically coupled with one another in the diagonal direction, the first through-via 1401 of the fourth stacked chip 74 may be electrically and sequentially coupled with the second through-via 1302 of the third stacked chip 73, the third through-via 1203 of the second stacked chip 72, and the fourth through-via 1104 of the first stacked chip 71, which are disposed in the diagonal direction. In addition, the first through-via 1301 of the third stacked chip 73 may be electrically and sequentially coupled with the second through-via 1202 of the second stacked chip 72 and the third through-via 1103 of the first stacked chip 71, which are disposed in the diagonal direction. Therefore, the output path of the first data R2DQ0<0> of the third stacked chip 73 may be the same as the output path the first data R1DQ0<0> of the first stacked chip 71. In addition, the output path of the first data R2DQ1<0> of the fourth stacked chip 74 may be the same as the output path the first data R1DQ1<0> of the second stacked chip 71. Therefore, the first and second ranks RANK1 and RANK2 may share the output path of data of the corresponding sequence of the corresponding channel. Although FIG. 7 shows each of two ranks having two stacked chips, those skilled in the art may understand that the concept of the invention may be applied to a semiconductor apparatus having more than two ranks, each of which may include more than two stacked chips.

The base chip 75 may have a data output section 752 and a repair information generation section 753, which are the same as the data output section 520 and the repair information generation section 530 included the base chip 35 described above with reference to FIGS. 3 to 6. The data output section 752 may be the same as the data output section 520 except that the through-vias electrically coupled with each of the output selection units therein are different due to different number of the channels included in the semiconductor apparatus 4. The repair information generation section 753 may be the same as the repair information generation section 530. The repair information generation section 753 may also generate the first to third control signals RL<0:n>, RM<0:n>, and RR<0:n> based on the repair information.

Figure 8:
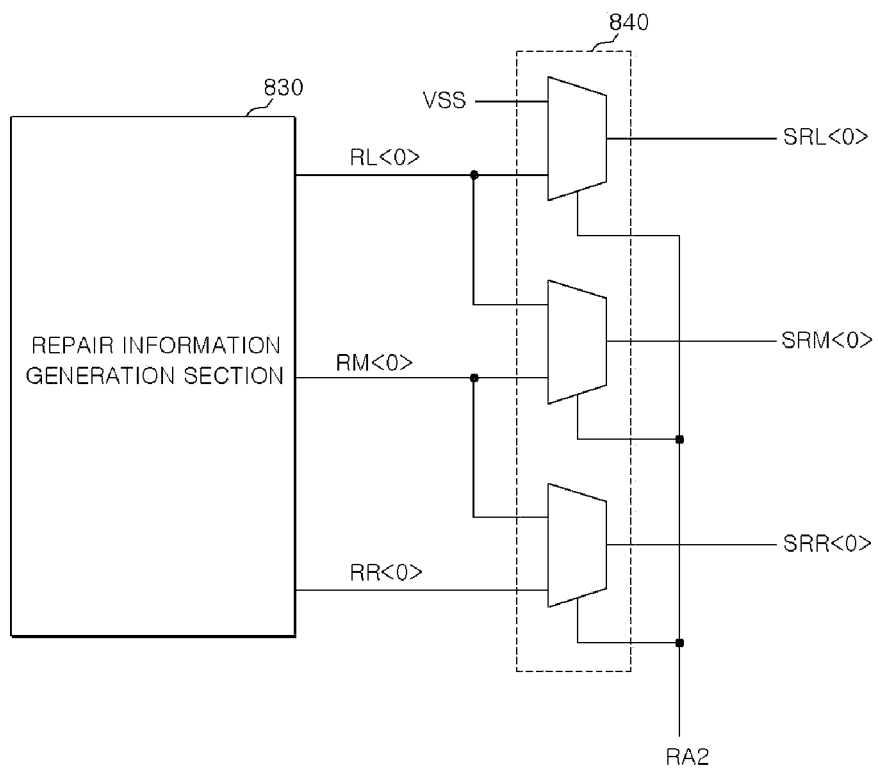
FIG. 8 is a circuit diagram illustrating a rank/repair information generation section shown in FIG. 7.

Referring to FIG. 8, a circuit diagram illustrating the rank/repair information generation section 743 shown in FIG. 7 is described. The rank/repair information generation section 743 may include a repair information generation unit 830, and a control signal selection unit 840. The repair information generation unit 830 may be the same as the repair information generation section 430 described above with reference to FIG. 3. The repair information generation unit 830 may also generate the first to third control signals RL<0:n>, RM<0:n>, and RR<0:n> based on the repair information. For a clear description, generation of single control signal will be described. The control signal selection unit 840 may selectively output the first to third control signals RL<0:n>, RM<0:n>, and RR<0:n> in response to the rank information signals. The control signal selection unit 840 may output the first to third selection control signals SRL<0:n>, SRM<0:n>, and SRR<0:n> from the first to third control signals RL<0:n>, RM<0:n>, and RR<0:n> in response to the second rank information signal RA2. In response to the second rank information signal RA2, the control signal selection unit 840 may output the first control signal RL<0> as the second selection control signal SRM<0>, and may output the second control signal RM<0> as the third selection control signal SRR<0>. In addition, the control signal selection unit 840 may output the ground voltage VSS as the first selection control signal SRL<0>. The first to third selection control signals SRL<0:n>, SRM<0:n>, and SRR<0:n> may be inputted the data transmission section 742 in the same way as the first to third control signals RL<0:n>, RM<0:n>, and RR<0:n> are inputted to the data transmission section 420 described above with reference to FIG. 4. Therefore, the enabled second control signal RM<0> may be provided as the third selection control signal SRR<0> to the data transmission section 742. Further, the data transmission section 742 in response to the third selection control signal SRR<0> may change the through-via array originally supposed to transfer the channel data to the through-via array disposed in the left side of the through-via array originally supposed to transfer the channel data. In other words, in the third and fourth stacked chips 73 and 74 shown in FIG. 7, the first data R2DQ0<0> and R2DQ1<0> may be transferred through the first through-vias 1301 and 1401. The second data R2DQ0<1> and R2DQ1<1> may be transferred through the third through-vias 1303 and 1403, and the third and fourth data R2DQ0<2:3> and R2DQ1<2:3> may be transferred through the fifth and seventh through-vias 1305 and 1307, and 1405 and 1407, respectively.

The rank/repair information generation section 743 included in each of the first and second stacked chips 71 and 72 may receive the first rank information signal instead of the second rank information signal RA2. Therefore, the rank/repair information generation section 743 included in each of the first and second stacked chips 71 and 72 may output the first to third control signals RL<0:n>, RM<0:n>, and RR<0:n> as the first to third selection control signals SRL<0:n>, SRM<0:n>, and SRR<0:n>. Further, the data transmission section 742 may not change the through-via array originally supposed to transfer the channel data. Therefore, in the first and second stacked chips 71 and 72 shown in FIG. 7, the first data R1DQ0<0> and R1DQ1<0> may be transferred through the third through-vias 1103 and 1203. In addition, the second to fourth data R1DQ0<1:3>, R1DQ1<1:3> may be transferred through the fifth, seventh, and ninth through-vias 1105, 1107, and 1109, and 1205, 1207, and 1209, respectively. Therefore, the data paths of the third stacked chip 73 may be the same as the data paths of the first stacked chip 71, respectively. Further, the data paths of the fourth stacked chip 74 may be the same as the data paths of the second stacked chip 72, respectively, which allows the plural ranks to share the channels.

Figure 9:
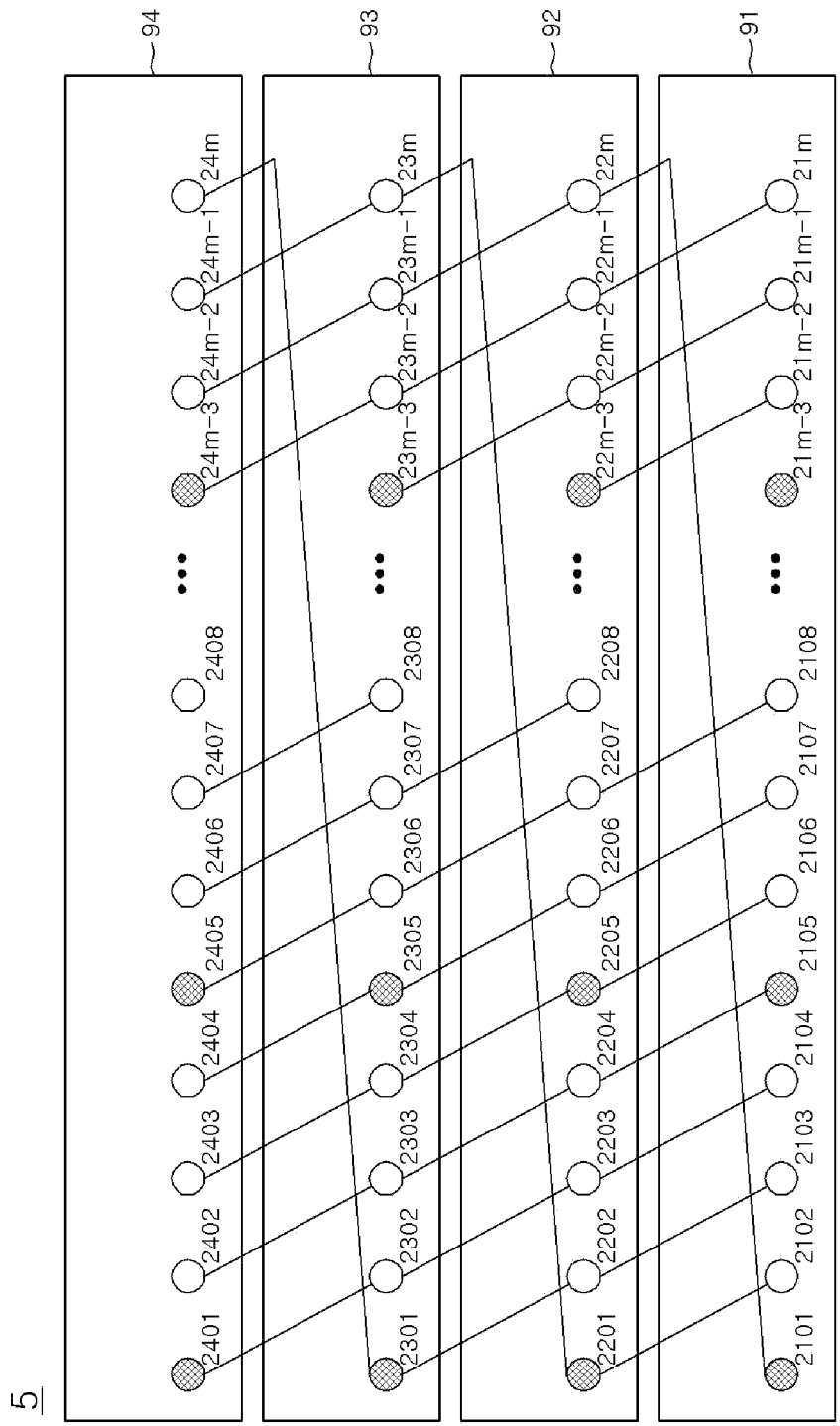
FIG. 9 is a schematic diagram illustrating a semiconductor apparatus in accordance with an embodiment of the invention.

Referring to FIG. 9, a schematic diagram illustrating a semiconductor apparatus 5 in accordance with an embodiment of the invention is shown. Referring to FIG. 9, the semiconductor apparatus 5 may include first to fourth stacked chips 91 to 94. The first to fourth stacked chips 91 to 94 may include first to eighth through-vias 2101 to 2108, 2201 to 2208, 2301 to 2308, and 2401 to 2408, and (m-3)th to (m)th through-vias 21m-3 to 21m, 22m-3 to 22m, 23m-3 to 23m, and 24m-3 to 24m, respectively. The (m-3)th to (m)th through-vias 21m-3 to 21m, 22m-3 to 22m, 23m-3 to 23m, and 24m-3 to 24m may be the repair through-via arrays. Similar to the semiconductor apparatus 3, the first through-vias 2101, 2201, and 2301 in each of the first to third stacked chips 91 to 93 may be electrically coupled with less numbers of another through-vias than the other through-vias. In other words, the first through-via 2101 of the first stacked chip 91 may be electrically coupled with single through-via, the first through-via 2201 of the second stacked chip 92 may be electrically coupled with two through-vias, and the first through-via 2301 of the third stacked chip 93 may be electrically coupled with three through-vias. On the other hand, the other through-vias may be electrically coupled with four through-vias. Since the through-vias are electrically coupled with one another in the diagonal direction, the coupling relationship of the through-vias of the last through-via array may be point-symmetrical to the coupling relationship of the through-vias of the first through-via array. Therefore, referring once more to FIG. 9, the (m)th through-via 24m of the fourth stacked chip 94 may be electrically coupled with single through-via. In addition, the (m)th through-via 23m of the third stacked chip 93 may be electrically coupled with two through-vias. Further, the (m)th through-via 22m of the second stacked chip 92 may be electrically coupled with three through-vias. In order to balance loading of the first to eighth through-vias 2101 to 2108, 2201 to 2208, 2301 to 2308, and 2401 to 2408, and the (m-3)th to (m)th through-vias 21m-3 to 21m, 22m-3 to 22m, 23m-3 to 23m, and 24m-3 to 24m in each of the first to fourth stacked chips 91 to 94, the first through-via 2101 of the first stacked chip 91 may be electrically coupled to the (m)th through-via 22m of the second stacked chip 92. Further, the first through-via 2201 of the second stacked chip 92 may be electrically coupled to the (m)th through-via 23m of the third stacked chip 93. In addition, the first through-via 2301 of the third stacked chip 93 may be electrically coupled to the (m)th through-via 24m of the fourth stacked chip 94. Therefore, the first through-vias 2101, 2201, and 2301 in each of the first to third stacked chips 91 to 93 may be electrically coupled with four numbers of the through-vias such as the other through-vias, and thus may have the same load as the other through-vias. Therefore, a skew between the channel data transferred through the first through-vias 2101, 2201, and 2301 in each of the first to third stacked chips 91 to 93, and the channel data transferred through the other through-vias may be minimized. The comprisal of the semiconductor apparatus 5 may be applied to the semiconductor apparatuses 3 and 4 described above with reference to FIGS. 1 to 8 with proper modification.

While certain embodiments have been described above, it will be understood to those skilled in the art that the embodiments described are by way of example only. Accordingly, the stacked semiconductor apparatus and the semiconductor system capable of inputting signals through various paths should not be limited based on the described embodiments. Rather, the stacked semiconductor apparatus and the semiconductor system capable of inputting signals through various paths described should only be limited in light of the claims that follow when taken in conjunction with the above description and accompanying figures.

What is claimed is:

1. A semiconductor apparatus comprising a plurality of stacked chips, wherein each of the plurality of stacked chips comprises:
    first to Mth through-vias, each formed by penetrating each of the plurality of stacked chips at corresponding locations, wherein M is a number greater than or equal to 3;
    an input/output circuit, electrically coupled to a $\{1+(L*K)\}$th through-via of the plurality of stacked chips, wherein L is $\{0, 1, \ldots, K-1\}$ when K>2 and L is $\{0, 1\}$ when K=2; and
    a data transmission section configured to transmit data to one of $\{1+(J*K)\}$th through-via, $\{1+((J-1)*K)\}$th through-via, and $\{1+((J+1)*K)\}$th through-via based on repair information, wherein J is less than M, and wherein K represents a number of channels of the semiconductor apparatus.

2. The semiconductor apparatus of claim 1, wherein each of the first to Mth through-vias of the plurality of stacked chips is electrically coupled with a through-via in a neighboring stacked chip in a diagonal direction.

3. The semiconductor apparatus of claim 1,
    wherein each group of first to Kth through-vias and $\{M-(K-1)\}$th to Mth through-vias of the plurality of stacked chips forms a repair through-via array, and
    wherein (1+K)th to (M–K)th through-vias of the plurality of stacked chips form a plurality of normal through-via arrays.

4. The semiconductor apparatus of claim 1, wherein the data transmission section comprises:
    a transmission selection unit configured to transmit one of first to third data to the $\{1+(L*K)\}$th through-via based on the repair information.

5. The semiconductor apparatus of claim 4, each of the plurality of stacked chips further comprises:
    a repair information generation section configured to generate first to third control signals based on the repair information, and to provide the first to third control signals to the transmission selection unit.

6. The semiconductor apparatus of claim 1,
    further comprising a base chip stacked with the plurality of stacked chips,
    wherein the base chip comprises a data output section configured to output a signal transferred through one of the $\{1+(J*K)\}$th through-via, the $\{1+((J-1)*K)\}$th through-via, and the $\{1+((J+1)*K)\}$th through-via of a neighboring stacked chip with the base chip as data of a first channel.

7. The semiconductor apparatus of claim 6, wherein the data output section outputs a signal transferred through one of the $\{2+(J*K)\}$th through-via, the $\{2+((J-1)*K)\}$th through-via, and the $\{2+((J+1)*K)\}$th through-via as data of a second channel.

8. The semiconductor apparatus of claim 1,
    wherein one or more among the plurality of stacked chips, which are stacked in a lower part form a first rank,
    wherein one or more among the plurality of stacked chips, which are stacked in a upper part, form a second rank,
    wherein each of the stacked chips of the first rank transmits data of a first channel through $\{1+(J*K)\}$th through-via in response to a first rank information signal, and
    wherein each of the stacked chips of the second rank transmits data of the first channel through $\{1+((J-1)*K)\}$th through-via in response to a second rank information signal.

9. The semiconductor apparatus of claim 8, wherein the data transmission section outputs one of first to third data through the $\{1+(L*K)\}$th through-via based on the repair information, and the first and second rank information signals.

10. The semiconductor apparatus of claim 9, wherein each of the plurality of stacked chips further comprises:
    a repair information generation section configured to generate first to third control signals based on the repair information; and
    a control signal selection unit configured to selectively output the first to third control signal in response to the first and second rank information signals.

11. The semiconductor apparatus of claim 1, wherein the first through-via of each of the plurality of stacked chips is electrically coupled with the Mth through-via of one of the plurality of stacked chips.

12. A semiconductor apparatus comprising first to Nth stacked chips, wherein each of the first to Nth stacked chips comprises first to Mth through-vias, each of which is disposed at corresponding locations and electrically coupled with a through-via of an adjacently stacked chip in a diagonal direction, wherein N is a natural number greater than or equal to 2, and M is a natural number greater than or equal to 3,
    wherein each of the first to Nth stacked chips comprises
        a data transmission section configured to transmit data to $\{1+(L*K)\}$th through-via based on repair information, wherein L is $\{0, 1, \ldots, K-1\}$ when K>2 and L is $\{0, 1\}$ when K=2, and
    wherein K represents a number of channels of the semiconductor apparatus.

13. The semiconductor apparatus of claim 12, wherein the first through-via of each of the first to Nth stacked chips is electrically coupled with the Mth through-via of an adjacently stacked chip.

14. The semiconductor apparatus of claim 12, wherein the data transmission section transmits first data to one of $\{1+(J*K)\}$th through-via, $\{1+((J-1)*K)\}$th through-via, and $\{1+((J+1)*K)\}$th through-via based on the repair information, wherein J is a natural number.

15. The semiconductor apparatus of claim 14, wherein the data output section transmits second data to one of $\{1+(J*K)\}$th through-via, $\{1+((J+1)*K)\}$th through-via, and $\{1+((J+2)*K)\}$th through-via based on the repair information.

16. The semiconductor apparatus of claim 12,
    further comprising a base chip,
    wherein the base chip comprises a data output section configured to output a signal transferred through one of the {1+(J*K)}th through-via, the {1+((J−1)*K)}th through-via, and the {1+((J+1)*K)}th through-via of an adjacently stacked chip as data of a first channel, wherein J is a natural number.

17. The semiconductor apparatus of claim 16, wherein the data output section outputs a signal transferred through one of the {2+(J*K)}th through-via, the {2+((J−1)*K)}th through-via, and the {2+((J+1)*K)}th through-via of the stacked chips adjacently stacked as data of a second channel.

* * * * *